United States Patent [19]

Fujihira

[11] Patent Number: 5,053,838
[45] Date of Patent: Oct. 1, 1991

[54] POWER INTEGRATED CIRCUIT

[75] Inventor: Tatsuhiko Fujihira, Kanagawa, Japan

[73] Assignee: Fuji Electric Co., Ltd., Kanagawa, Japan

[21] Appl. No.: 633,145

[22] Filed: Dec. 24, 1990

[30] Foreign Application Priority Data

Dec. 25, 1989 [JP] Japan .................................. 1-336051
Sep. 27, 1990 [JP] Japan .................................. 2-258525

[51] Int. Cl.$^5$ ............................................ H01L 29/78
[52] U.S. Cl. ................................ 357/23.4; 357/23.12; 357/42; 357/43; 357/48
[58] Field of Search ................... 357/42, 43, 48, 23.4, 357/23.12

[56] References Cited

U.S. PATENT DOCUMENTS 4,881,107  11/1989  Matsushita .................. 357/48

Primary Examiner—Edward J. Wojciechowicz
Attorney, Agent, or Firm—Finnegan, Henderson, Farabow, Garrett, and Dunner

[57] ABSTRACT

A power integrated circuit having an improved trade-off between on-state resistance and break down voltage. The circuit contains multiple devices, disposed over a drain electrode, including a vertical double-diffused MOS(VDMOS) translator having a buries layer of low resistivity interposed between an $n^{30}$-type substrate and an $n^-$-epitaxial layer in the current path between the drain electrode and the source. The on-state resistance of the integrated circuit is lowered by the provision of the buried layer, while the breakdown voltage of the integrated circuit is heightened by making the resistance of the $n^-$-epitaxial layer high.

10 Claims, 3 Drawing Sheets

POWER INTEGRATED CIRCUIT

BACKGROUND OF THE INVENTION

1. Field of the Invention

The present invention relates to a power integrated circuit, and more particularly to a self-isolated power integrated circuit provided with a semiconductor device such as a vertical double-diffused MOSFET (VDNOS) in which low on-state resistance is realized.

2. Description of the Related Art

Conventional high-output power integrated circuits (ICs) can be roughly classified into three types. The first type is a self-isolated power IC described in, for example, "Smart SIPMOS Technology", J. Tihany, Siemens Forsh. -u. Entwickl. -Ber. Bd17 (1988), Nrl, pp. 35–42.

The second type is a junction-isolated power IC described in, for example, "Smart Power Motor Driver for Low Voltage Applications", D. Cave et al., IEEE 1987 Custom Integrated Circuits Conference, pp. 276–279, 1987.

The third type is a dielectrically-isolated power IC described in, for example, "Dielectrically Isolated Intelligent Power Switch", Y. Ohata and T. Isumita, IEEE 1987 Custom Integrated Circuits Conference, pp. 443–446, 1987.

Of these three types of power ICs, the self-isolated power IC to which the present invention is applied will be described with reference to FIG. 3. An n$^+$-type substrate 2 has a drain electrode 110 on the bottom surface and an n$^-$-type epitaxial layer 3 on the top surface. A VDMOS surface structure 11 on n$^-$-type epitaxial layer 3 includes channel layers 51, sources 81, a gate insulating layer 6, a gate electrode 71, an interlayer insulation layer 9, a field insulating layer 4, and a source electrode 101.

A PMOS device 12 on n$^-$-type epitaxial layer 3 includes a source layer 52, a drain layer 53, a gate insulating layer 6, a gate electrode 72, a source electrode 102, and a drain electrode 103.

A NMOS device 13 includes a P-well 54, a source layer 82, a drain layer 83, a gate electrode 73, a drain electrode 104, and a source electrode 105.

A diode 14 on n$^-$-type epitaxial layer 3 includes an anode layer 55, a cathode-layer 84, an anode electrode 106, and a cathode electrode 107.

By using a silicon wafer as a raw material which is obtained by forming a lightly doped n$^-$-type substrate 3 through an epitaxial growth technique, the self-isolated power IC as shown in FIG. 3 is produced, for example, through the following steps (1)–(8).

(1) After formation of field insulating layers 4 through thermal oxidation, windows are formed in the field insulating layers 4 through photolithography and etching.

(2) Boron ion injection and thermal diffusion are performed by a photoresist patterned through photolithography to form source layers 52 and drain layer 53 of P-channel MOSFET (PMOS) 12, P well 54 of N-channel MOSFET (NMOS) 13, and anode layer 55 of diode 14.

(3) After formation of gate insulating layers 6 through thermal oxidation, polycrystalline silicon is deposited on gate insulting layers 6 through a Chemical Vapor Deposition (CVD) method, phosphorous ions are injected into the deposited silicon, the silicon is heat-treated so that doping is made to form n$^+$-type conductive regions 71, 72 and 73, and, concurrently, a gate electrode 71 of VDMOS surface structure 11, gate electrode 72 of PMOS 12, and gate electrode 73 of NMOS 13 are formed through photolithography and etching.

(4) channel layers 51 are formed through boronion injection and heat treatment by photoresist masks patterned through photolithography.

(5) Similarly, source layers 81 of VDMOS surface structure 11, source layer 82 and drain layer 83 of NMOS 13, and cathode layer 84 of diode 14 are simultaneously formed through arsenic ion injection and heat treatment by photoresist masks patterned through photolithography.

(6) PSG (phosphorus glass) is deposited through a CVD method and windows are formed in the deposited glass through photolithography and etching to form inter-layer insulation layers 9.

(7) Aluminum is deposited with a sputtering method and the deposited aluminum is patterned through photolithography and etching to form a source electrode 101 of VDMOS surface structure 11, source electrode 102 and drain electrode 103 of PMOS 12, source electrode 105 and drain electrode 104 of NMOS 13, and anode electrode 106 and cathode electrode 107 of diode 14.

(8) Finally, drain electrode 110 of VDMOS surface structure 11 is formed through metal evaporation.

For simplicity of description, only an outline of the process steps have been described. It is possible for a process to use additional diffusion layers or wiring layers. Further, it is possible to produce semiconductor devices other than the example shown in FIG. 3.

The power IC illustrated in FIG. 3 may constitute a drive circuit, a protection circuit, a control circuit, etc. by use of PMOS 12, NMOS 13, and diode 14, and can be used as a high-breakdown voltage and large-current power IC by use of a VDMOS, including VDMOS surface structure 11, as an output device.

The self-isolation type power IC tends to be less expensive than either the junction-isolated type or the dielectrically-isolated type, because both the junction-isolated and dielectrically-isolated types involve a relatively large number of complicated process steps to manufacture. The conventional self-isolated type power IC, however, tends to have a high on-state resistance. An explanation for the high on-state resistance of the self-isolated type power IC is given below.

FIG. 4 is an enlarged sectional view showing the VDMOS, including VDMOS surface structure 11, of FIG. 3. In FIG. 4, the on-state resistance $R_{on}$ of the VDMOS is expressed primarily as the sum of a resistance $R_{ch}$ at a channel portion, a resistance $R_{JFET}$ due to the pinch-off effect of the n$^-$-type epitaxial layer sandwiched between channel layers 51, and a resistance $R_{epi}$ due to the n$^-$-type epitaxial layer:

$$R_{on} = R_{ch} + R_{JFET} + R_{epi} \tag{1}$$

Expression (1) is explained in detail in, for example, "Optimum Design of Power MOSFET'S", C. Hu, et al., IEEE Trans. Electron Devices, vol. ED-31, No. 12, pp. 1693–1700, 1984.

In expression (1), the resistance $R_{epi}$ of the n$^-$-type epitaxial layer is substantially proportional to the resistivity $\rho$ and thickness $t_2$ of the n$^-$-type epitaxial layer and can be expressed with a proportional constant a:

$$R_{epi} = a \cdot \rho \cdot t_2 \tag{2}$$

Taking the foregoing into consideration, the cause of the high on-state resistance of the conventional self-isolated power IC shown in FIG. 3 will now be further explained.

The isolation breakdown voltage of the circuit of FIG. 3 is determined by the device with the lowest breakdown voltage. Thus, the isolation breakdown voltage of each semiconductor device used in the circuit shown in FIG. 3 (the breakdown voltage against the drain electrode 110 of the VDMOS) must be not lower than the rated (assigned) breakdown voltage of the power IC. Let the breakdown voltage of the VDMOS, the isolation breakdown voltage of PMOS 12, and the isolation breakdown voltage of NMOS 13 be $BV_{dss}$, $BV_p$, and $BV_N$ respectively. A typical relation between these breakdown voltages may be expressed as follows.

$$BV_{dss} - BV_p = BV_N \qquad (3)$$

However, in diode 14, there is a parasitic bipolar transistor structure in which the cathode layer 84 acts as an emitter, anode layer 55 acts as a base, and $n^-$-type epitaxial layer 3 and $n^+$-type substrate 2 act as a collector. Thus, the isolation breakdown voltage of diode 14 is a collector-emitter breakdown voltage $V_{CEO}$ of the parasitic bipolar transistor. Generally, $$V_{CEO} = 0.4 \sim 0.7 \times V_{CBO} \qquad (4)$$

where, $V_{CBO}$ is a collector-base breakdown voltage.

In the case of the power IC as shown in FIG. 4, therefore, the following relation is established.

$$V_{CBO} = BV_{dss} - BV_p = BV_N \qquad (5)$$

Accordingly, the breakdown voltage of the power IC is determined by the breakdown voltage $V_{CEO}$ and this breakdown voltage is between 0.4 and 0.7 times the breakdown voltage $BV_{dss}$.

In the conventional power circuit, in order to mitigate lowering of the breakdown voltage due to its dependence of $V_{CEO}$, resistivity $\rho$ and thickness $t_2$ of the $n^-$-type epitaxial layer are large to set $V_{CEO}$ high. The large resistivity $\rho$ and thickness $t_2$, however, results in a large $R_{epi}$, as shown in expression (2). A large $R_{epi}$ results in a large on-state resistance $R_{on}$, as shown in expression (1). Thus, in the conventional circuit there is a trade-off between on-state resistance and breakdown voltage.

SUMMARY OF THE INVENTION

An object of the present invention is to improve the trade-off between on-state resistance and isolation breakdown voltage of self-isolated power integrated circuit to provide an inexpensive circuit that is low in on-state resistance.

To achieve this object according to one aspect of the present invention an integrated circuit comprises a semiconductor substrate of a first conductivity type and having a first doping level; a first semiconductor region on a selected area of the substrate; a second semiconductor epitaxial region of the first conductivity type on the first region in an area in vertical alignment with the selected area and on the substrate in an area laterally removed from the selected area, and having a doping level less than the first doping level; a semiconductor device, on the top surface of the second semiconductor epitaxial region in an area laterally removed from the selected area; an electrode on the substrate, separated from the first semiconductor region, in an area in vertical alignment with the selected area and in the area laterally removed from the selected area; and a transistor of the vertical field effect type, in vertical alignment with the selected area, wherein the first semiconductor region has a resistivity related to the breakdown voltage between the device electrode and the substrate electrode. The semiconductor device includes a device electrode. The transistor includes a third semiconductor region of a second conductivity type on the second semiconductor region, a fourth semiconductor region of the first conductivity type on the third semiconductor region, a source electrode, coupled to the fourth epitaxial region, and a gate electrode.

To achieve this object according to another aspect of the present invention a method of making a semiconductor device comprises the steps of forming a thermal oxidation layer on a substrate of a first conductivity type; forming a window through photolithography and etching a portion in a selected area; injecting ions into the window; heat treating to diffuse the ions into substrate; removing the thermal oxidation layer; depositing an epitaxial layer of a first conductivity type through an epitaxial growth method, allowing the injected ions to diffuse in the epitaxial layer and form a buried layer of the first conductivity type in an area corresponding to the window.

Briefly, in a circuit consisting of multiple devices, the invention provides for lowering the on-state resistance while heightening the breakdown voltage of the all power IC device.

The accompanying drawings, which are incorporated in and which constitute a part of this specification, illustrate one embodiment of the invention and, together with the description, explain the principles of the invention.

DETAILED DESCRIPTION OF THE PREFERRED EMBODIMENT

A power integrated circuit (IC), having an improved trade off between on-state resistance and break down voltage, according to the preferred embodiment of the present invention will now be described. The preferred embodiment contains multiple devices, disposed over a drain electrode, including a vertical double-diffused MOS (VDMOS) transistor having a buried layer of low resistivity interposed between an $n^+$-type substrate and an $n^-$-epitaxial layer in the current path between the drain electrode and the source. In this circuit configuration, the on-state resistance of the integrated circuit is lowered by the provision of the buried layer, while the breakdown voltage of the whole integrated circuit is heightened by making the resistance of the $n^-$-epitaxial layer high, thereby improving the trade-off between on-state resistance and breakdown voltage.

Figure 1:
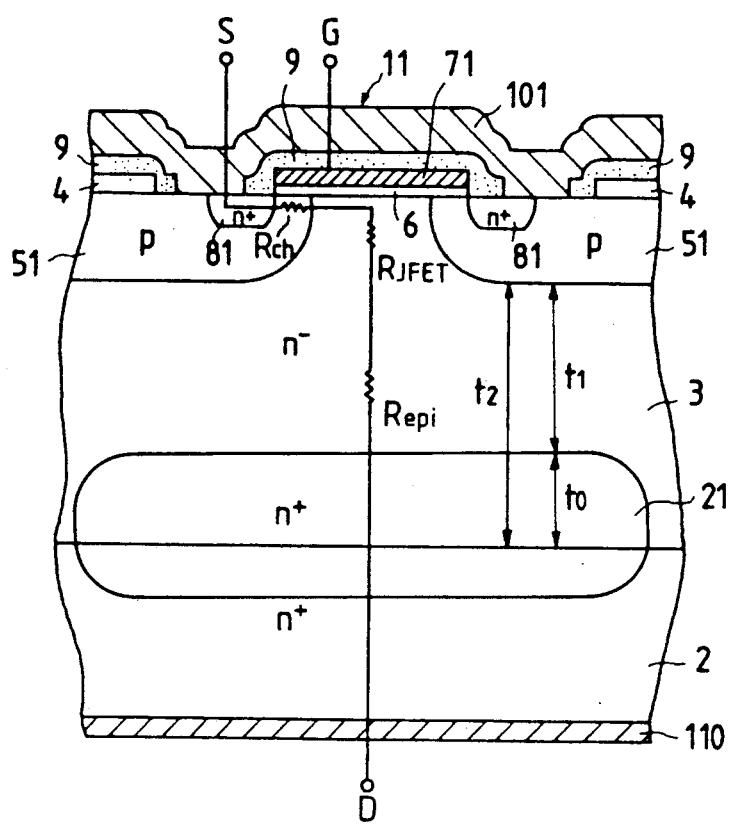
FIG. 1 is a sectional view showing an embodiment of the present invention in a VDMOS.
Figure 4:
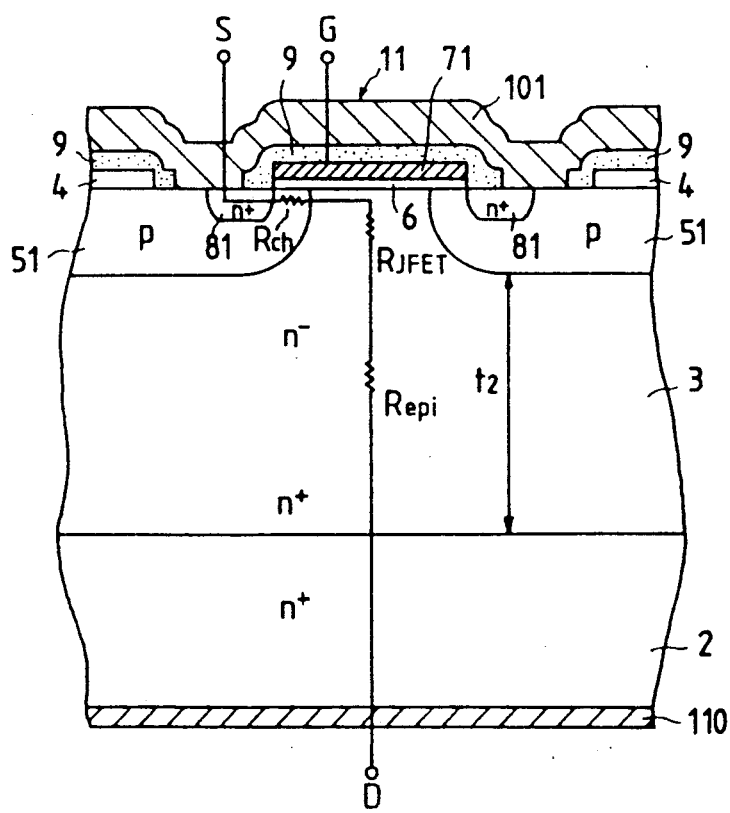
FIG. 4 is a sectional explanatory view showing a VDMOS portion of FIG. 3 in detail.

FIG. 1 is a sectional view showing an embodiment in which the present invention is applied to a VDMOS, such as the one shown in FIG. 4. A VDMOS surface structure 11 contains an epitaxial n+ buried channel 21 interposed between an n+-type substrate 2 and a n− epitaxial layer 3 in vertical alignment with VDMOS surface structure 11. Accordingly, the thickness of the n− layer in the VDMOS is reduced, thereby reducing resistance of the n− layer shown in the expression (2).

As shown in FIG. 1, the thickness $t_2$ of the n−-type epitaxial layer 3 is reduced to a thickness $t_1(-t_2-t_0)$ thereby reducing the resistance $R_{epi}$ of n−-type epitaxial layer 3 from $a \cdot \rho \cdot t_2$ to $a \cdot \rho \cdot t_1$. Reducing the n−-resistance $R_{on}$ shown in the expression (1). As a result, the on-state resistance $R_{on}$ is reduced.

Although the breakdown voltage $BV_{dss}$ is lowered as the on-state resistance $R_{on}$ is lowered, the lowering of the on-state resistance can be achieved without lowering the breakdown voltage of the whole of the power IC, provided that the breakdown voltage $BV_{dss}$ is not lowered below the breakdown voltage $V_{CEO}$, the lowest individual device breakdown voltage in the IC.

Figure 2:
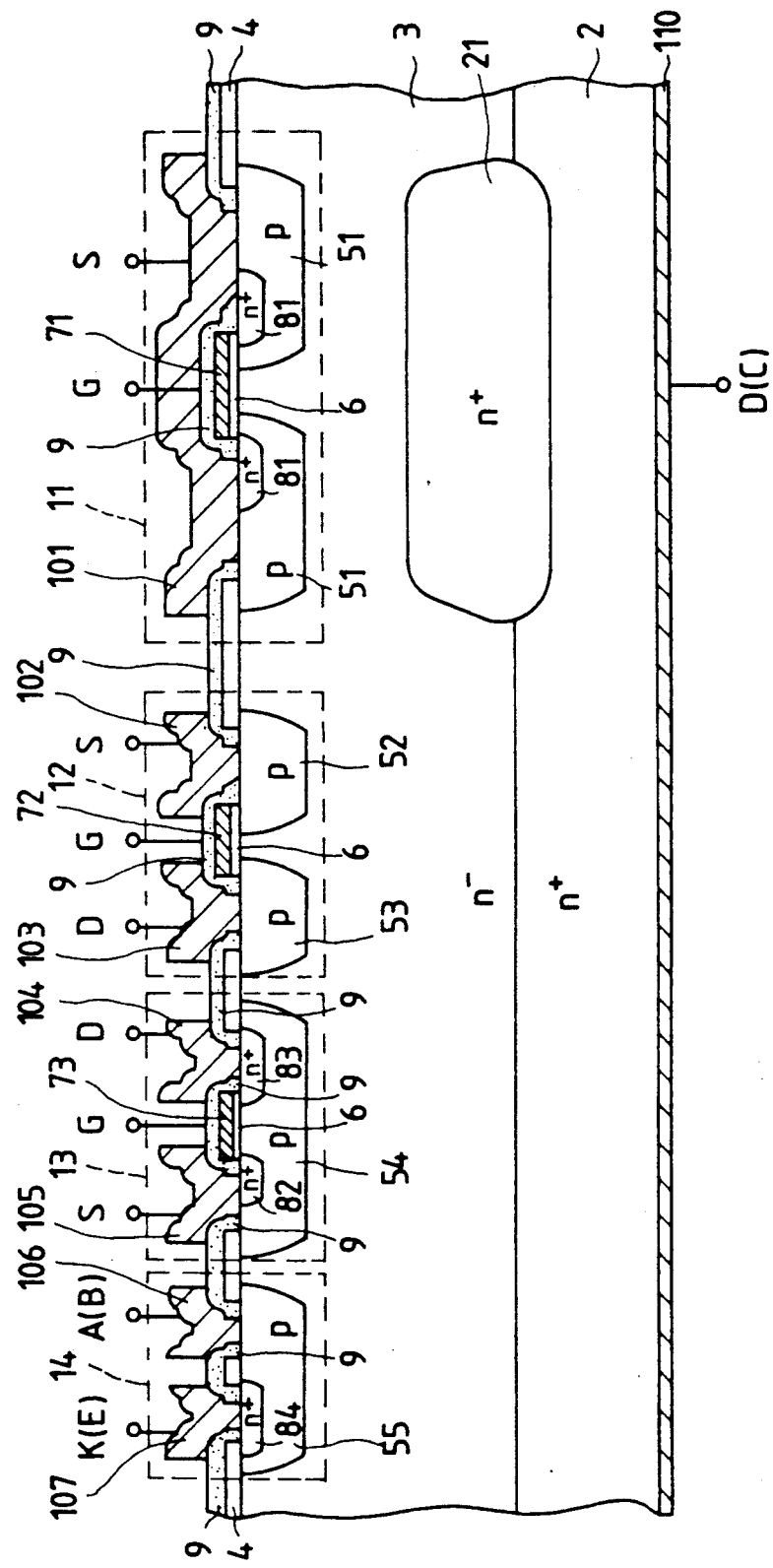
FIG. 2 is a sectional view showing the VDMOS of FIG. 1 in a self-isolated power integrated circuit.
Figure 3:
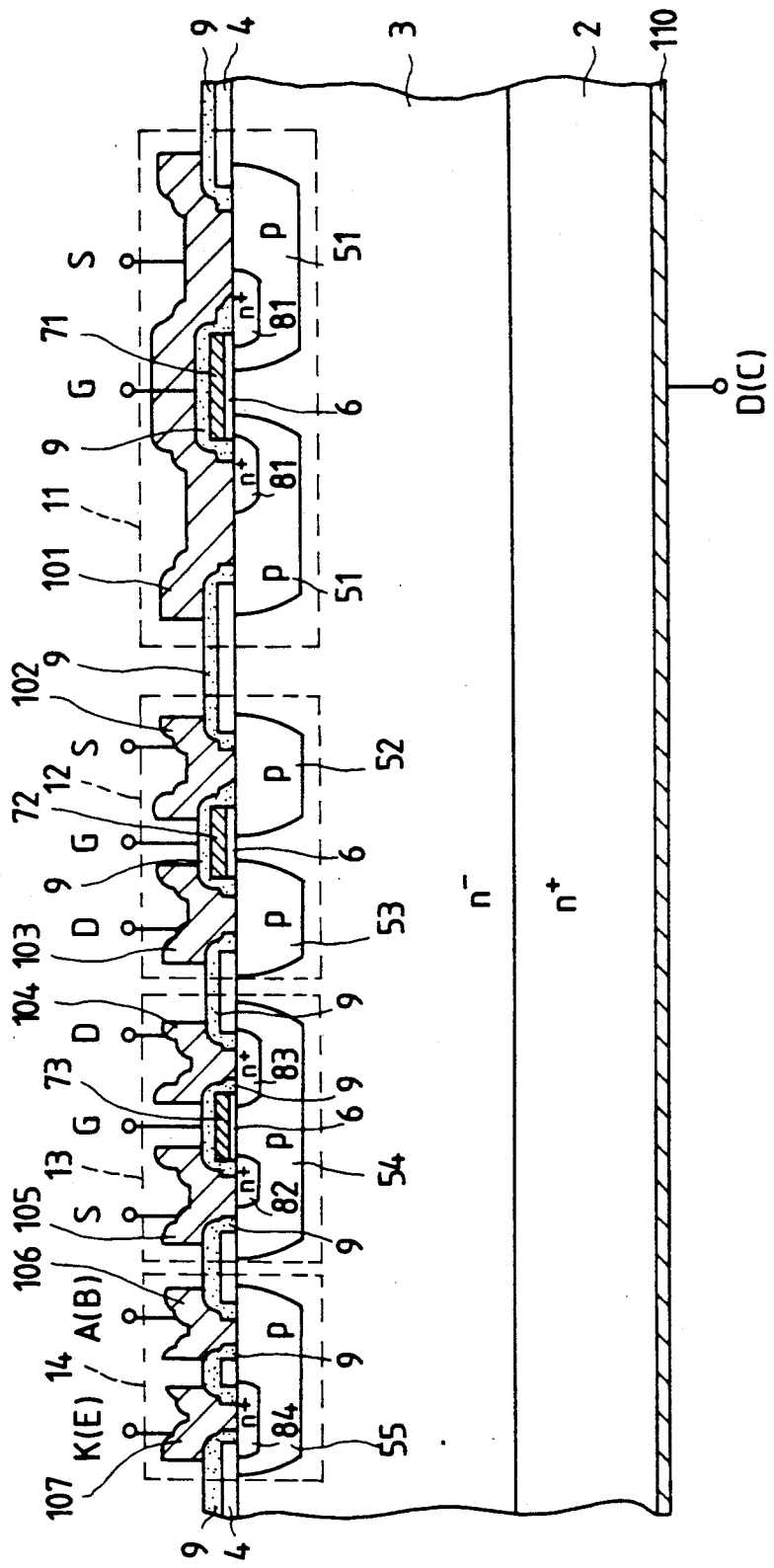
FIG. 3 is a sectional view showing an example of a conventional self-isolated power integrated circuit.

FIG. 2 is a sectional view showing the VDMOS in a self-isolated power IC, analogous to the one shown in FIG. 3. The embodiment shown in FIG. 2 can be produced by adding steps to the method of making the example of FIG. 3. The n+-type buried layer 21 is formed through photolithography and injection of phosphorous ions before the n−-type epitaxial layer 3 is grown on the n+-type substrate 2, as described in detail below.

(1) A thermal oxidation layer having a thickness of 1 μm is formed on the n+-type substrate 2 of 0.01 Ωcm, and a window is formed through photolithography and etching with a hydrofluoric acid in a portion where the n+-type buried layer 21 is to be formed. After injection of phosphorous ions of $1 \times 10^{15}/cm^2$ at 100 keV into the window, heat treatment is performed at 1100° C. for two hours to diffuse the phosphorous ions into the n+-type substrate 2. The thermal oxidation layer is then removed by chemical etching with hydrofluoric acid.

(2) The n−-type epitaxial layer 3 of 2.8 Ωcm having a thickness of 11 μm is deposited through an epitaxial growth method. At this time, the phosphorous ions previously led through ion injection are diffused into the n−-type epitaxial layer 3, so that the n+-type buried layer 21 begins to form. The final thickness of the n+-type buried layer 21 is determined by diffusion caused by heat treatment in the following steps.

(3) An insulating layer having a thickness of 1 μm is formed through thermal oxidation at 1100° C. for three hours, and unnecessary portions are removed through photolithography and etching with a hydrofluoric acid to form field insulating layers 4.

(4) Through a resist mask formed through photolithography, boron ions of $1 \times 10^{13}/cm^2$ are injected at 100 keV into a position where a P-well is to be formed. Similarly, through resist masks formed through photolithography, boron ions of $1 \times 10^{14}/cm^2$ are injected at 100 keV into positions where source layer 52 and drain layer 53 of PMOS 12 and an anode layer 55 of diode 14 are to be formed. After the removal of the resist mask heat treatment is performed at 1100° C. for approximately 4 hours to form source layer 52 and drain layer 53 of PMOS 12, P-well 54 of NMOS 13, and anode layer 55 of diode 14.

(5) Gate insulating layers 6 of 500 Å are formed through thermal oxidation.

(6) After a polycrystalline silicon layer of about 1 μm is deposited on gate insulating layers 6 through a CVD method, phosphorous ions of $1 \times 10^{16}/cm^2$ are injected at a 100 keV and heat-treatment is performed at 1000° C. for half an hour to thereby perform doping to form the n+-type polycrystalline silicon regions 71, 72 and 73. Unnecessary portions of the polycrystalline silicon region are removed through photolithography and plasma etching, so that the respective gate electrodes 71, 72, and 73 VDMOS surface structure 11, PMOS 12, and NMOS 13 are formed.

(7) Boron ions of $1.5 \times 10^{13}/cm^2$ are injected at 100 keV by using a resist mask patterned through photolithography and the gate electrode 71 as masks. The resist mask is then removed and heat-treatment is performed at 1100° C. for four hours to form channel layers 51 of VDMOS surface structure 11.

(8) Similarly arsenic ions of $1 \times 10^{16}/cm^2$ are injected at 100 keV by using a resist mask patterned through photolithography and gate electrodes 71 and 73, and field insulating layers 4 as masks. After the removal of the resist mask heat-treatment is made at 1000° C. for half an hour to form source layer 81 of VDMOS surface structure 11, source layer 82 and drain layer 83 of NMOS 14, and cathode layer 84 of diode 14.

(9) PBS (phosphorous glass) of 1 μm is deposited through a CVD method, and windows are formed through etching with photolithography and etching with a hydrofluoric acid to form inter-layer insulation layers 9.

(10) After deposition of aluminum of 2 μm through a sputtering method, unnecessary portions are removed through photolithography and an RIE (reactive ion etching) method to form source electrode 101 of VDMOS surface structure 11, source electrode 102 and drain electrode 103 of PMOS 12, source electrode 105 and drain electrode 104 of NMOS 13, anode electrode 106 and cathode electrode 107 of the diode 14.

(11) Titanium of 0.5 μm, nickel of 0.5 μm, and gold of 0.5 μm are deposited on the back surface of n+-type substrate 2 through a vacuum evaporation method to form a drain electrode 110.

Table 1 shows a comparison of the actually produced power ICs of the embodiment shown in FIG. 2 and the conventional example shown in FIG. 3. As shown in Table 1, when circuits each having a breakdown voltage of 80 V are produced, the on-state resistance is 5.5 mΩcm² in the conventional circuit, while in the embodiment shown in FIG. 2 the on-state resistance is reduced approximately 36% to 3.5 Ωcm².

TABLE 1

|  | Conventional Type | Embodiments of Invention |
|---|---|---|
| Resistivity of n− epitaxial layer | 2.8 Ωcm | 2.8 Ωcm |
| Thickness of n− epitaxial layer and thickness of n+ buried layer | $t_2 = \mu$ | $t_2 = 8\mu$ $t_1 = 4\mu$ $t_0 = 4\mu$ |
| $V_{CEO}$ of parasitic bipolar transistor | 80 V | 80 V |
| Isolation breakdown voltage of NMOS | 130 V | 130 V |
| Isolation breakdown voltage of PMOS | 130 V | 130 V |
| Breakdown voltage of VDMOS | 130 V | 80 V |
| Breakdown voltage of the whole IC | 80 V | 80 V |
| $R_{ON} \cdot A$ of VDMOS | 5.5 mΩcm² | 3.5 mΩcm² |

In general, characteristics of the buried layer in the VDMOS can be varied in accordance with the lowest device breakdown voltage in the IC, in order to improve the trade-off between on-state resistance and breakdown voltage in the IC. Characteristics of the buried layer can be set so that the VDMOS will have a breakdown voltage matching the other device. As suggested above, therefore, resistivity of the buried layer will be directly related to the lowest device breakdown voltage, and thickness of the buried layer will be inversely related to the lowest device breakdown voltage. The resistivity of the buried layer is inversely related to doping level in the buried layer.

Thus, in the self-isolated power IC according to the preferred embodiment of the present invention, on-state resistance of the IC can be lowered without lowering a breakdown voltage of the IC.

Additional advantages and modifications will readily occur to those skilled in the art. The invention in its broader aspects is therefore not limited to the specific details, representative apparatus, and illustrative examples shown and described. Accordingly, departures may be made from such details without departing from the spirit or the scope of applicant's general inventive concept.

What is claimed is:

1. An integrated circuit comprising:
    a semiconductor substrate of a first conductivity type and having a first doping level;
    a first semiconductor region on a selected area of the substrate;
    a second semiconductor epitaxial region of the first conductivity type on the first semiconductor region in an area in vertical alignment with the selected area and on the substrate in an area laterally removed from the selected area, and having a doping level less than the first doping lavel;
    a semiconductor device, on the top surface of the second semiconductor epitaxial region in an area laterally removed from the selected area including
    a device electrode;
    an electrode on the substrate, separated from the first region, in an area in vertical alignment with the selected area and in the area laterally removed from the selected area; and
    a transistor of the vertical field effect type, in vertical alignment with the selected area, including
    a third semiconductor region of a second conductivity type on the second semiconductor epitaxial region,
    a fourth semiconductor region of the first conductivity type on the third semiconductor region,
    a source electrode, coupled to the fourth region, and
    a gate electrode wherein the first semiconductor region has a resistivity related to the breakdown voltage between the device electrode and the substrate electrode.

2. The integrated circuit according to claim 1, wherein the first semiconductor region has a second doping level, and the second semiconductor epitaxial region has a doping level less than the second doping level.

3. The integrated circuit according to claims 1 or 2, wherein the first semiconductor region has a resistivity such that the breakdown voltage between the transistor electrode and the substrate electrode is substantially equal to the breakdown voltage between the semiconductor device electrode and the substrate electrode.

4. The integrated circuit according to claim 2, wherein the first semiconductor region has a doping level inversely related to the breakdown voltage between the device electrode and the substrate electrode.

5. The integrated circuit according to claim 4, wherein the first semiconductor region has a coping level such that the breakdown voltage between the transistor electrode and the substrate electrode is substantially equal to the breakdown voltage between the semiconductor device electrode and the substrate electrode.

6. The integrated circuit of claims 4 or 5, wherein the semiconductor device comprises a diode, a PMOS and an NMOS.

7. An integrated circuit comprising:
    a semiconductor substrate of a first conductivity type and having a first doping level;
    a first semiconductor region having a second doping level on a selected area of the substate;
    a second semiconductor eptaxial region of the first conductivity type on the first semiconductor region in an area in vertical alignment with the selected area and on the substrate in an area laterally removed from the selected area, and having a doping level less than the first and second doping levels;
    a semiconductor device, on the top surface of the second semiconductor epitaxial layer in an area laterally removed from the selected area including
    a device electrode;
    an electrode on the substrate, separated from the first semiconductor region, in an area in vertical alignment with the selected area and in the area laterally removed form the selected area; and
    a transistor of the vertical field effect type, in vertical alignment with the selected area, including
    a third semiconductor region of a second conductivity type on the second semiconductor region,
    a fourth semiconductor region of the first conductivity type on the third semiconductor region,
    a source electrode, coupled to the fourth epitaxial region, and
    a gate electrode wherein the first semiconductor region has a thickness inversely related to the breakdown voltage between the semiconductor device electrode and the substrate electrode.

8. The integrated circuit according to claim 7, wherin the first semiconductor region includes
    a first semiconductor region of the first conductivity type having a second doping level,
    wherein the second semiconductor epitaxial region has a doping level less than the second doping level.

9. The integrated circuit according to claims 7 or 8, wherein the first semiconductor region has a thickness such that the breakdown voltage between the transistor electrode and the substrate electrode is substantially equal to the breakdown voltage between the semiconductor device electrode and the substrate electrode.

10. The integrated circuit of claim 9, wherein the semiconductor device comprises a diode, a PMOS and an NMOS.

* * * * *

UNITED STATES PATENT AND TRADEMARK OFFICE
CERTIFICATE OF CORRECTION

PATENT NO. : 5,053,838

DATED : October 01, 1991

INVENTOR(S) : Tatsuhiko Fujihira

It is certified that error appears in the above-identified patent and that said Letters Patent is hereby corrected as shown below:

ON THE TITLE PAGE:

In the Abstract, line 5, after MOS(VDMOS), change "translator" to --transistor--.

In the Abstract, line 5, change "buries" to --buried--.

In the Abstract, line 6, change "$n^{30}$" to --$n^+$--.

Claim 7, column 8, line 37, after "removed" change "form" to --from--.

Claim 8, column 8, line 50, change "wherin" to --wherein--.

Signed and Sealed this

Twenty-ninth Day of March, 1994

Attest:

BRUCE LEHMAN

*Attesting Officer*       *Commissioner of Patents and Trademarks*